United States Patent [19]

Prins

[11] Patent Number: 4,997,636

[45] Date of Patent: Mar. 5, 1991

[54] DIAMOND GROWTH

[76] Inventor: Johan F. Prins, 8 Portland Place, Northcliff Extension 15, Johannesburg, Transvaal, South Africa

[21] Appl. No.: 482,457

[22] Filed: Feb. 15, 1990

[30] Foreign Application Priority Data

Feb. 16, 1989 [ZA] South Africa .................. 89/1207

[51] Int. Cl.$^5$ .............................................. C01B 31/08
[52] U.S. Cl. .......................... 423/446; 156/DIG. 68; 427/38; 501/86; 204/192.31
[58] Field of Search .................. 423/446; 501/86; 156/DIG. 68; 427/38; 204/192.12, 192.31

[56] References Cited

U.S. PATENT DOCUMENTS

| | | | |
|---|---|---|---|
| 4,603,082 | 7/1986 | Zelez | 427/38 |
| 4,800,100 | 1/1989 | Herbots et al. | 427/38 |
| 4,816,291 | 3/1989 | Desphandey et al. | 427/38 |
| 4,869,923 | 9/1989 | Yamazaki | 427/38 |
| 4,915,977 | 4/1990 | Okamoto et al. | 427/38 |
| 4,917,953 | 4/1990 | Hioki et al. | 427/38 |

FOREIGN PATENT DOCUMENTS

| | | | |
|---|---|---|---|
| 143070 | 7/1980 | German Democratic Rep. | 423/446 |
| 59-35092 | 2/1984 | Japan | 423/446 |
| 60-103099 | 6/1985 | Japan | 423/446 |
| 60-127298 | 7/1985 | Japan | 423/446 |
| 60-195094 | 10/1985 | Japan | 423/446 |
| 1485364 | 9/1977 | United Kingdom | 423/446 |

OTHER PUBLICATIONS

Freeman et al., "Epitaxial Synthesis of Diamond by Carbon-Ion Deposition at Low Energy", Nature, vol. 275, Oct. 19, 1978, pp. 634–635.

Moravec et al., "Electron Spectroscopy of Ion Beam and Hydrocarbon Plasma Generated Diamondlike Carbon Films", J. Vol. Sci. Technol., 18(2) Mar. 1981, pp. 226–228.

J. L. Robertson et al., Science, 1989, vol. 243, pp. 1047–1050.

Primary Examiner—Olik Chaudhuri
Assistant Examiner—Robert M. Kunemund
Attorney, Agent, or Firm—Scully, Scott, Murphy & Presser

[57] ABSTRACT

A diamond film is grown on a substrate by providing a non-diamond substrate which has a face-centered cubic (fcc) crystal structure and small crystal lattice mismatch with the lattice of diamond, implanting carbon atoms into the crystal lattice of the substrate and causing the implanted carbon atoms to diffuse out of the substrate and grow epitaxially on the surface of the substrate. The preferred substrate is an fcc metal such as copper, nickel, fcc iron, fcc cobalt or fcc chromium.

8 Claims, No Drawings 4,997,636

DIAMOND GROWTH

BACKGROUND OF THE INVENTION

This invention relates to diamond growth.

It is now well established that metastable diamond growth may be generated by a variety of plasma-assisted chemical vapour deposition techniques. However, what has not yet been accomplished and is sorely needed in electronic applications, is the growth of large area single crystalline diamond wafers. The road to this objective is via epitaxial growth on a suitable substrate material. Epitaxial growth of diamond on to diamond has been achieved. However, the substrate area of a diamond cannot be made large because of its cost and availability and it is difficult to remove diamond overgrowth from the diamond substrate.

SUMMARY OF THE INVENTION

According to the present invention, there is provided a method of producing diamond or a diamond-like layer including the steps of providing a non-diamond substrate which has a face-centred cubic (fcc) crystal structure and small crystal lattice mismatch with the lattice of diamond, inserting carbon atoms into the crystal lattice of the substrate by means of ion implantation and causing the implanted carbon atoms to diffuse out of the substrate and grow epitaxially on a surface of the substrate.

DESCRIPTION OF EMBODIMENTS OF THE INVENTION

The mismatch between the crystal lattice of the substrate and that of diamond must be sufficiently close to allow epitaxial growth to take place. Epitaxial growth occurs when the crystal being grown takes on the crystal lattice or structure of the substrate on which it is grown.

The substrate is preferably an fcc metal such as copper, nickel, fcc iron, fcc cobalt or fcc chromium. The crystal lattice of all these metals is close to that of diamond. Nickel and copper are the preferred metals.

The implantation of the carbon atoms will take place by ion implantation methods known in the art and will result in carbon atoms penetrating the crystal lattice of the substrate. The carbon atoms implanted into the substrate crystal will not be "frozen" in but will, at a suitable temperature, diffuse out of the lattice to a surface where epitaxial growth will occur. Obviously the conditions of implantation should be such as to prevent any internal metal carbide or other solid solution being formed.

Diffusion of the carbon atoms out of the crystal lattice of the substrate will only take place if the substrate is at an elevated temperature. The temperature at which this occurs will vary from substrate to substrate but will be at least 100° C. In the case of nickel a typical temperature range is 150 ° C. to 400° C. At temperature in excess of 400° C. the risk of carbide formation increases. In the case of copper, higher temperatures can be employed. Generally the temperature will not exceed the melting temperature of the substrate or the temperature at which there is degradation of the diamond layer being produced. The latter depends on the quality of the vacuum obtained in the ion implanter's end station and would typically be around 1000° C. for a vacuum of $1 \times 10^{-6}$ torr.

The ion implantation may take place at a variety of ion energies and doses. The higher the ion energy the deeper will be the penetration of the ion. The higher the dose the thicker the diamond film which can be produced. By way of example, ion energies may be in the KeV or MeV ranges and typical doses will be of the order of $10^{18}$ ions/cm$^2$ for KeV energies.

The substrate can be produced having a relatively large surface and it is thus possible to produce large diamond layers or films thereon. The diamond layer or film may easily be removed from the substrate, particularly if that substrate is a metal in which case removal can be achieved by digestion in a suitable acid.

The method of the invention may be used to grow a thin epitaxial diamond film on a substrate. Thereafter, known plasma or other chemical vapour deposition methods may be used to increase the diamond growth on the already-formed diamond film. Examples of chemical vapour deposition methods are described in U.S. Pat. Nos. 4,434,188, 4,734,339 and 4,707,384 and EP 327051, the disclosures of which are incorporated herein by reference.

The invention will now be illustrated by the following example. A suitable nickel substrate is implanted with carbon ions while it is maintained at a temperature at which the carbon atoms introduced in this manner can diffuse. They diffuse towards, and segregate out at a nearby surface where they will add on to the surface using the nickel crystal structure as a template to form a diamond layer.

In a first experiment, a pure thin nickel disc was washed in a soapy solution followed by ultrasonic cleaning in acetone. It was then masked with a round hole, placed in an ion implanter, heated to a surface temperature of about 80° C. and implanted with C+ ions to a dose of $1 \times 10^{18}$ ions/cm$^2$. After switching on the ion beam, the surface temperature rose and stabilised at about 200° C. for most of the implantation. The implantation energy used was 120 KeV. After implantation, the implanted surface was covered with a greyish, shiny overlayer. The nickel plate was then placed in hot aqua regia which immediately attacked the surrounding nickel, but only formed bubbles on the implanted region. Etching proceeded very fast at the edges of the implanted area and after a while etched right through the nickel plate, leaving a round hole in it after the implanted round disc had separated from the original, bigger substrate. The acid then started to penetrate underneath the overlayer breaking it up into smaller pieces which floated to the top of the aqua regia (During the whole process, the overgrowth itself did not dissolve in the acid). Some of the larger pieces which floated were picked up on a microscope slide and refloated on the surface of distilled water from where they were lifted on to transmission electron microscope grids.

The transmission electron microscope showed up a fairly thick layer which displayed "amorphous" rings in the diffraction mode—as found for a finely grained material. An EDAX-scan did not show any nickel, but only traces of chlorine which could have been deposited by the aqua regia. Unfortunately EDAX cannot detect carbon atoms. However, owing to the face that only carbon and nickel could be present in large quantities, the absence of nickel indicates that the overgrowth could only have been carbon and in a form which is chemically inert even when submerged in hot aqua regia. Being finely grained, the layer could, at worst, have been diamond-like. However, within the experimental error of the broad rings, correlation with the diffraction pattern of diamond could be found. Pieces of this layer were then heated in a solution of nitric, perchloric and sulphuric acids which is known to dissolve graphite and amorphous carbon layers. They did not dissolve proving to be inert to this acid, as is diamond.

In a follow-up experiment a nickel disc was annealed to increase the grains in it, and afterwards etched in a 50/50 solution of HF and $HNO_3$ to show up these grains. The previous implantation was repeated but with the nickel surface pre-heated and maintained at a temperature of 400° C. During the etching stage in aqua regia, a very large piece of the overlayer came off in which the pattern of the underlying nickel grains could be seen. For certain grains the film showed a dark, grey colour, while it was highly transparent for other grains. Near the (110) and (111) directions the grains caused the highest transparency. The transmission electron microscope again showed a thick layer displaying diffraction rings which, however, were better defined than in the first experiment. In the transparent grains, diffraction spots were also observed together with the rings, showing that some crystalline order existed. EDAX again confirmed the absence of any nickel. The important observation in this experiment is that the crystallographic orientation of the nickel surface is playing a role, i.e. epitaxial processes are coming into play. The lattice spacing deduced from the diffraction spots correlated to that of diamond. Similar layers can be grown on copper at even higher temperatures than used for the nickel substrates, as copper does not form a carbide or any thermodynamically stable solution with carbon.

There are different ways in which the results obtained can be improved in order to obtain more perfect epitaxial, single crystalline diamond layers. Firstly, the ion doses used initially were chosen very high in order to generate thick films, which would be easy to handle. By reducing the ion doses to a low enough value (before the maximum vacancy density in the growing layer has been reached), a much thinner, but more perfect overgrowth can be obtained. In this regard it should be noted that a few monolayers of diamond should be enough to ensure further epitaxial growth when subsequently applying a plasma-CVD method. A monolayer of diamond contains in the order of $3 \times 10^{15}$ atoms/cm$^2$, which is not a very high ion does to implant.

Another method is to use thin nickel or copper crystals and to implant them through the back surface using very high energy carbon ions, i.e. in the MeV range, such that the carbon atoms end up near the front surface (which in this case is now not being bombarded) to which they can diffuse and add on epitaxially. The front and back surfaces will be spaced apart by a distance of less than 10 microns. High energy, high dose rate implanters have been developed to implant oxygen into silicon with the purpose of creating buried $SiO_2$-layers without damaging the intervening crystal layer. Such an implanter may be used to grow diamond layers at a fast rate using this technique. The higher the implantation energy of an ion, the less radiation damage the ions deposit near the surface they penetrate. Such an implanter would thus also be suitable to grow thick diamond layers by implantation through the growing layer as described above.

The orientation of the surface used for growing is of importance. Certain orientations are better suited for epitaxial interaction than others. Surfaces, e.g. the (111) or (110) planes, which cause channelling of the ions through the layer being grown bestow a distinct advantage by reducing the radiation damage in that layer.

I claim:

1. A method of producing a diamond or diamond-like layer includes the steps of providing a non-diamond substrate which has a face-centred cubic (fcc) crystal structure and small crystal mismatch with the lattice of diamond, inserting carbon atoms into the crystal lattice of the substrate by means of ion implantation and causing the implanted carbon atoms to diffuse out of the substrate and grow epitaxially on a surface of the substrate.

2. A method according to claim 1 wherein the substrate is an fcc metal.

3. A method according to claim 2 wherein the fcc metal is selected from the group of copper, nickel, fcc iron, fcc cobalt and fcc chromium.

4. A method according to claim 1 wherein the substrate is at an elevated temperature which allows the implanted carbon atoms to diffuse out of the substrate.

5. A method according to claim 4 wherein the temperature of the substrate is at least 100° C.

6. A method according to claim 1 wherein the surface of the substrate through which the implantation of the carbon atoms takes place is such as to cause channelling of the ions through the layer being produced thereby reducing radiation damage to this layer.

7. A method according to claim 1 wherein the substrate has a back surface and a front surface spaced apart by a distance of less than 10 microns and the atoms are implanted into the substrate through the back surface using high energy carbon ions in the MeV range and diffuse out of the substrate and grow epitaxially on the front surface of the substrate.

8. A method according to claim 1 wherein the substrate is removed from the diamond or diamond-like layer.

* * * * *